United States Patent
Hatori

(10) Patent No.: US 6,775,307 B2
(45) Date of Patent: Aug. 10, 2004

(54) LIGHT WAVELENGTH CONVERSION MODULE

(75) Inventor: Masami Hatori, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 73 days.

(21) Appl. No.: 09/794,173

(22) Filed: Feb. 27, 2001

(65) Prior Publication Data

US 2001/0019563 A1 Sep. 6, 2001

(30) Foreign Application Priority Data

Mar. 2, 2000 (JP) ........................................ 2000-056642

(51) Int. Cl.[7] .............................................. H01S 3/10
(52) U.S. Cl. ............................................ 372/22; 372/23
(58) Field of Search ...................... 372/75, 92, 20–24, 372/19–23

(56) References Cited

U.S. PATENT DOCUMENTS

| | | | | |
|---|---|---|---|---|
| 5,291,568 A | * | 3/1994 | Uemiya et al. | 359/326 |
| 5,301,059 A | * | 4/1994 | Kitaoka et al. | 359/332 |
| 5,315,433 A | * | 5/1994 | Okazaki et al. | 359/328 |
| 5,365,539 A | * | 11/1994 | Mooradian | 372/21 |
| 5,387,998 A | * | 2/1995 | Kitaoka et al. | 359/328 |
| 5,588,014 A | * | 12/1996 | Okazaki et al. | 372/105 |
| 5,652,757 A | * | 7/1997 | Okazaki et al. | 372/22 |
| 5,671,240 A | * | 9/1997 | Okazaki | 372/19 |
| 5,854,870 A | * | 12/1998 | Helmfrid et al. | 385/122 |

FOREIGN PATENT DOCUMENTS

| | | | | |
|---|---|---|---|---|
| JP | 6-242478 | | 9/1994 | |
| JP | 06-242478 | * | 9/1994 | G02F/1/37 |
| JP | 10-254001 | * | 9/1998 | G02F/1/37 |
| JP | 1 096 307 | * | 10/2000 | G02F/1/377 |
| JP | 2000-332346 | * | 11/2000 | H01S/5/062 |

* cited by examiner

Primary Examiner—Don Wong
Assistant Examiner—Tuan N. Nguyen
(74) Attorney, Agent, or Firm—Stroock & Stroock & Lavan LLP

(57) ABSTRACT

The present invention provides a light wavelength conversion module in which an output light amount of a light wavelength conversion element increases monotonically as a driving current of a semiconductor laser increases. The light wavelength conversion module includes the semiconductor laser having an external resonator provided with a narrow band-pass filter, and the light wavelength conversion element for converting a laser beam emitted from the semiconductor laser to a second harmonic wave. A semiconductor laser, which emits a laser beam including a plurality of longitudinal mode spectra within an acceptable wavelength band of the light wavelength conversion element, is used in the light wavelength conversion module.

31 Claims, 12 Drawing Sheets

[FIG. 1]
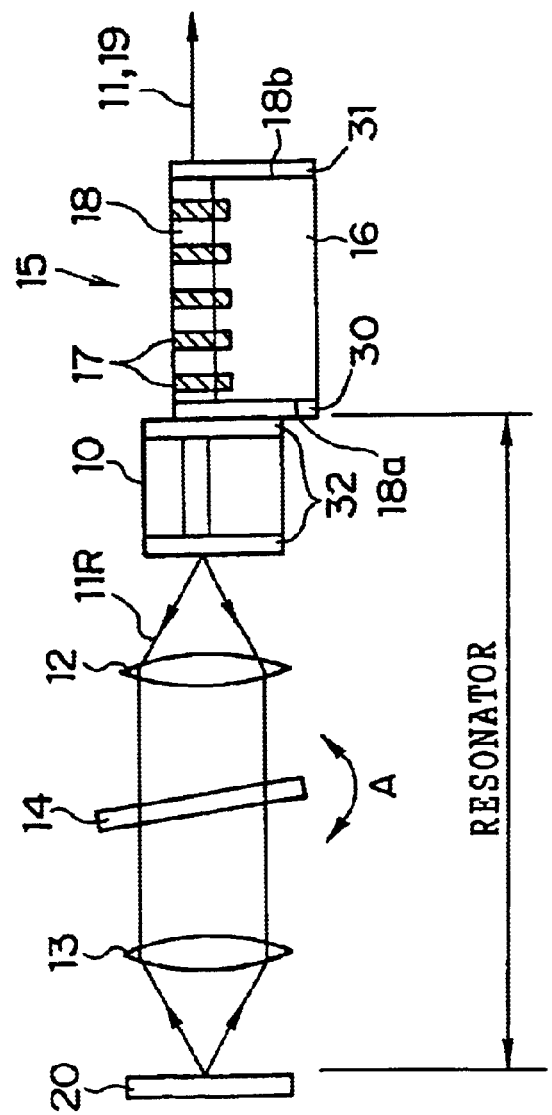

[FIG. 2]
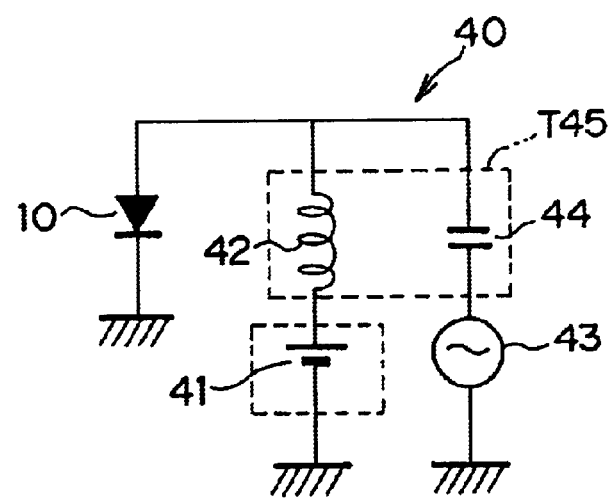

[FIG. 3]
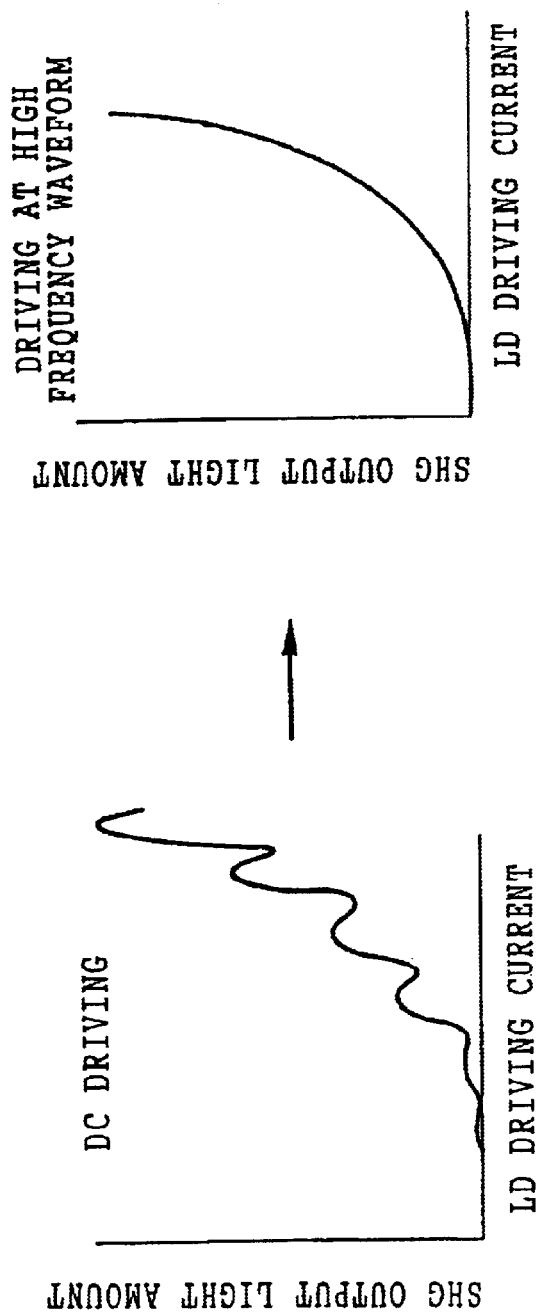

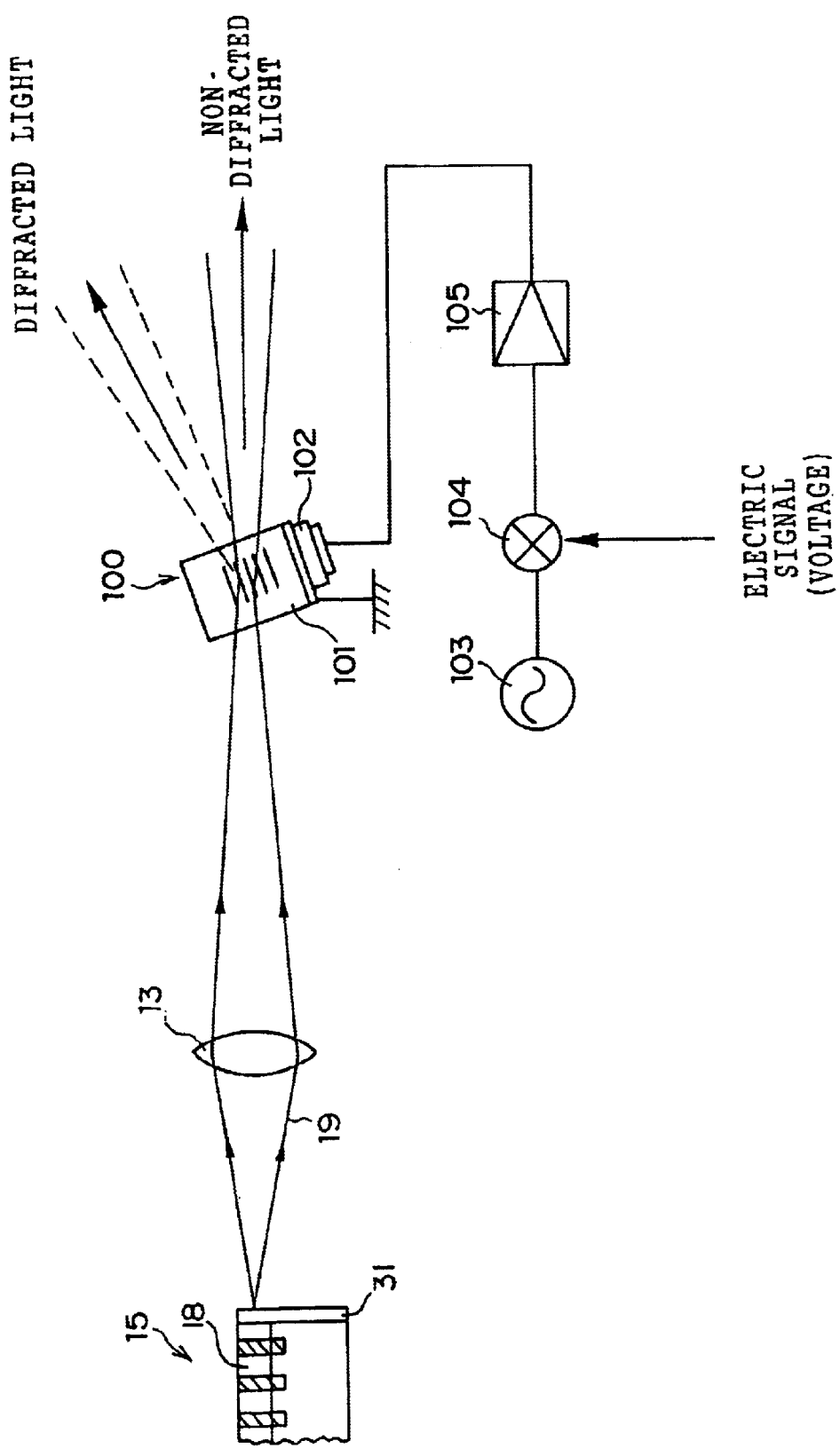
[FIG. 4]

[FIG. 5]
(A)
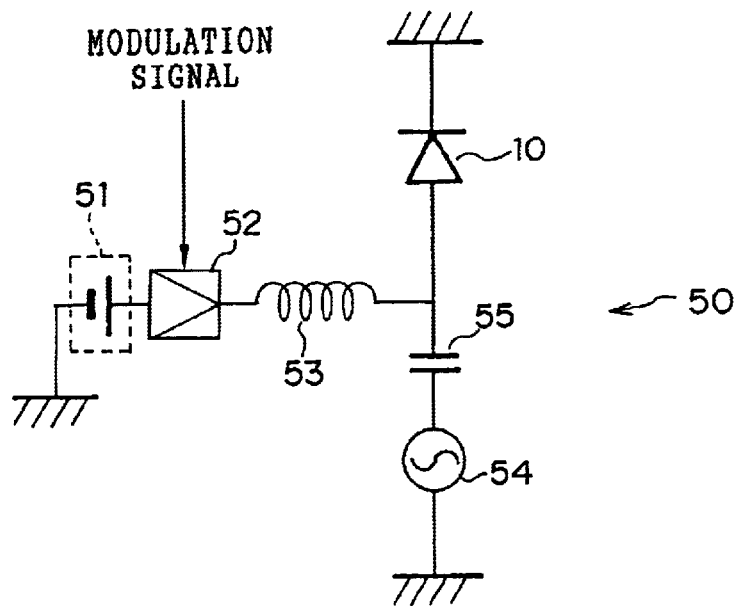
(B)
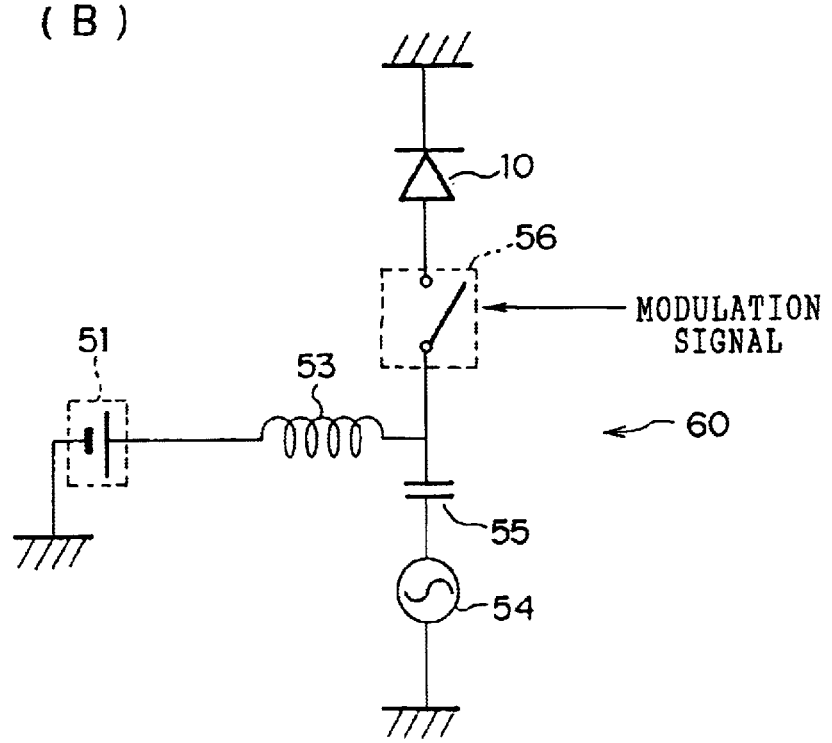

[FIG. 6]
(A)
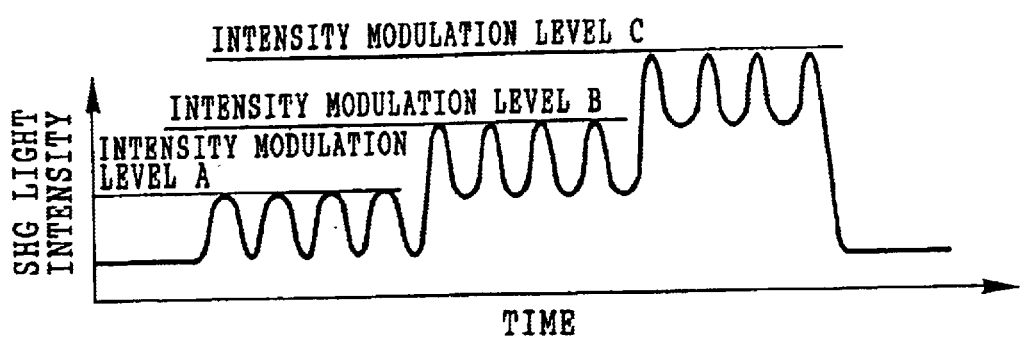
(B)
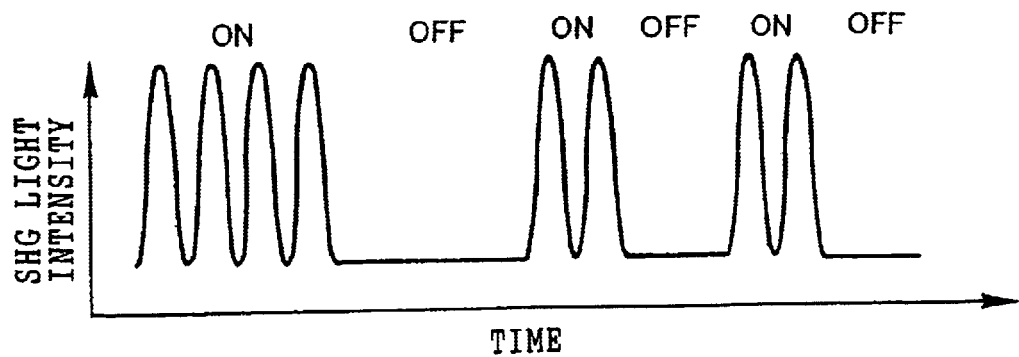

[FIG. 7]
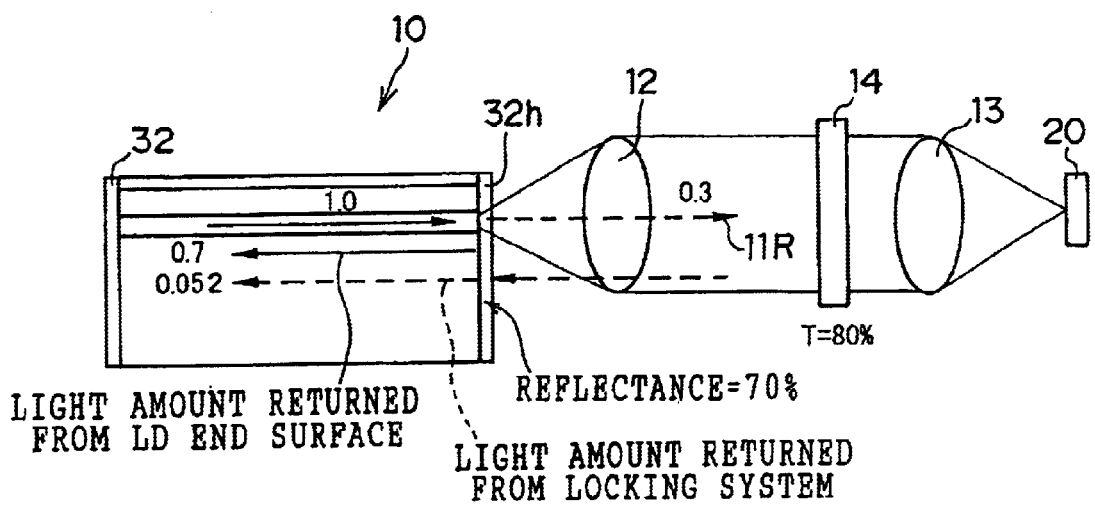

[FIG. 8]
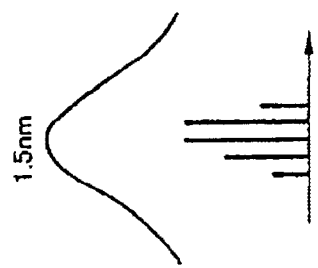
(C)
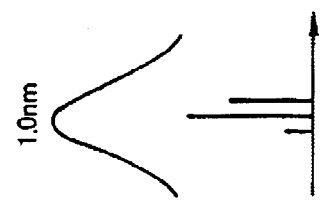
(B)
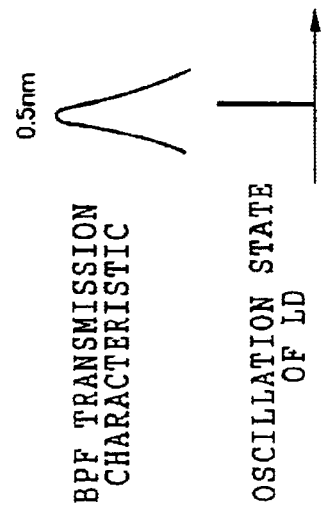
(A)
BPF TRANSMISSION CHARACTERISTIC
OSCILLATION STATE OF LD

[FIG. 9]
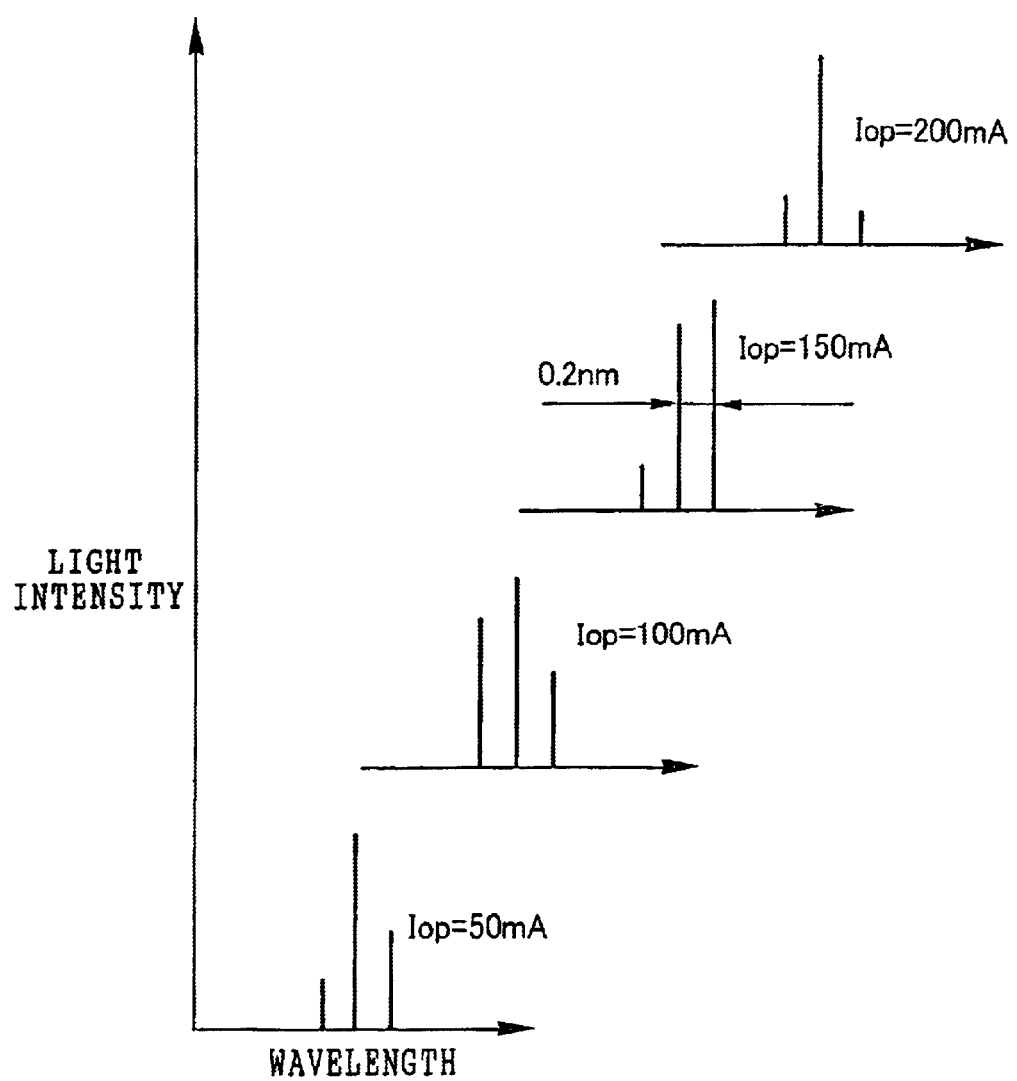

[FIG. 10]
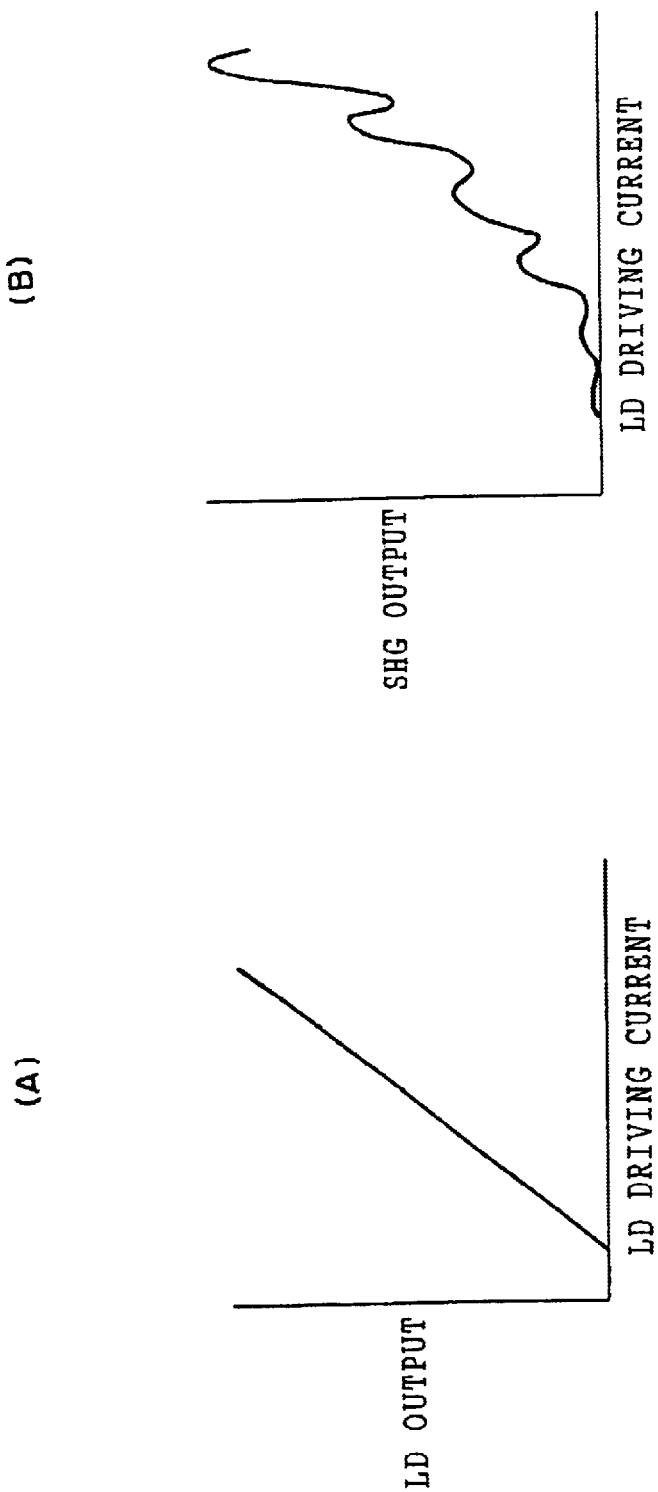

[FIG. 11]
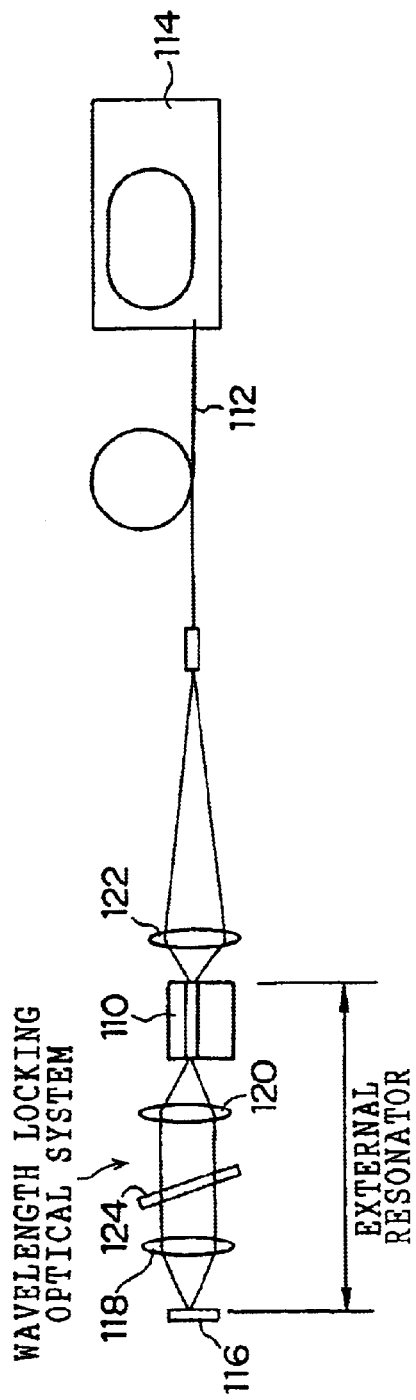

[FIG. 12]
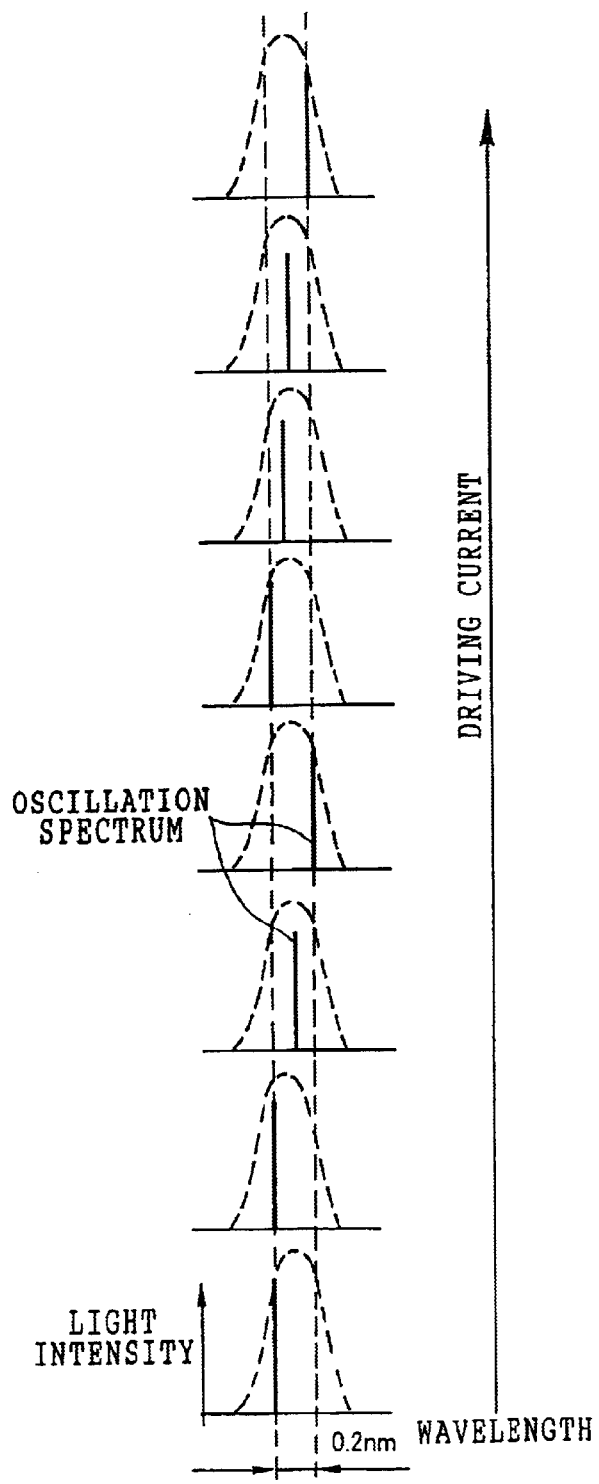

LIGHT WAVELENGTH CONVERSION MODULE

BACKGROUND OF THE INVENTION

1. Field of the Invention

The present invention relates to a light wavelength conversion module. More precisely, the present invention relates to a light wavelength conversion module which includes a semiconductor laser having an external resonator provided with a wavelength selecting element, and a light wavelength conversion element for converting a laser beam emitted from the semiconductor laser to a second harmonic wave or the like.

2. Description of the Related Art

Conventionally, various types of light wavelength conversion devices which convert a laser beam emitted from a semiconductor laser to a second harmonic wave or the like have been proposed, and have been used as a blue laser light source and/or a green laser light source. For example, a light wavelength conversion module is disclosed in Japanese Patent Laid-Open (JP-A) No. 10-254001. The light wavelength conversion module illustrated in FIG. 9 in this publication (JP-A No. 10-254001) includes a semiconductor laser which is provided with an external resonator and a wavelength selecting element such as a narrow band-pass filter or the like provided in the external resonator, and a light wavelength conversion element which is composed of a waveguide type second harmonic generation (SHG) element having a periodic domain reversing structure, wherein the semiconductor laser and the light wavelength conversion element are optically coupled directly with each other. In the light wavelength conversion module, a wavelength can be locked to a central transmitted wavelength of the narrow band-pass filter provided in the external resonator, and an oscillation wavelength of the semiconductor laser can be locked to a certain wavelength corresponding to a rotation angle of the narrow band-pass filter by rotating the filter.

A general semiconductor laser can oscillate a laser beam even without an external resonator since it has a resonator structure provided in an element thereof. However, the oscillation wavelength of the semiconductor laser prior to the locking of the wavelength fluctuates within a range of a few nanometers, and shifts toward the longer wavelength side as the driving current increases. For example, in a case in which the electric current is changed from 50 to 200 mA when a semiconductor laser having several longitudinal modes at intervals of about 0.2 nm is used, the central oscillation wavelength shifts about 5 nm toward the longer wavelength side due to heat generation of the semiconductor laser itself, as shown in FIG. 9 of the present application.

Therefore, when a semiconductor laser is optically coupled with an SHG element without locking the wavelength, the oscillation wavelength of the semiconductor laser does not coincide with a wavelength at which the wavelength conversion efficiency of the SHG element is maximized, i.e., does not coincide with a wavelength which phase-matches with the SHG element. The output light amount of the second harmonic wave fluctuates, resulting in almost no output of second harmonic waves. In order to solve this problem, in the light wavelength conversion module disclosed in JP-A No. 10-254001, an external resonator is provided, and an oscillation wavelength of the semiconductor laser is locked to a wavelength which phase-matches with the SHG element to thereby stabilize the outputted light amount of the second harmonic wave light.

However, even if the above-described locking of the wavelength is carried out, there still exists the following problem. The output light amount of the semiconductor laser itself increases linearly as the driving current of the semiconductor laser increases as shown in FIG. 10A when a threshold current ($I_{op}$) is exceeded. In contrast, the output light amount of the SHG element does not increase monotonically as the driving current of the semiconductor laser increases, but increases while repeatedly increasing and decreasing as shown in FIG. 10B, when the same semiconductor laser and SHG element are optically coupled to generate a second harmonic wave. That is, the IL characteristic (current vs. output characteristic) which expresses the relationship between the driving current of the semiconductor laser and the output light amount of the SHG element repeatedly increases and decreases.

When such increasing and decreasing of the output light amount occurs, there is a problem in that automatic power control (APC) for stabilizing the output light amount of the SHG element cannot be carried out properly when used. Moreover, there is another problem in that it is difficult to control the output light amount to a desirable amount when the output light of the SHG element is modulated by increasing and decreasing the driving current, since the output light amount of the SHG element does not increase monotonically as the driving current of the semiconductor laser increases.

SUMMARY OF THE INVENTION

The present invention is provided so as to solve the aforementioned problems, and an object of the present invention is to provide a light wavelength conversion module in which the output light amount of a light wavelength conversion element increases monotonically as the driving current of a semiconductor laser increases.

In order to solve the aforementioned problems, a first aspect of the present invention is a light wavelength conversion module including: (a) a light wavelength conversion element having a wavelength band, which when the light wavelength conversion element receives light within the wavelength band, emits light having a different wavelength; and (b) a semiconductor laser having an external resonator provided with a wavelength selecting element, the semiconductor laser being disposed for communicating light to the light wavelength conversion element and operable for producing light of a fundamental wavelength including a plurality of longitudinal mode spectra within the wavelength band of the light wavelength conversion element.

A second aspect of the present invention is a light wavelength conversion module including: (a) a light wavelength conversion element having a wavelength band, which when the light wavelength conversion element receives light within the wavelength band, emits light having a different wavelength; and (b) a semiconductor laser having opposite emitting end surfaces and an external resonator, the semiconductor laser being operable for producing light of a fundamental wavelength including a plurality of longitudinal mode spectra within the wavelength band of the light wavelength conversion element, which is disposed for receiving light from one emitting end surface of the semiconductor laser, and the external resonator being disposed for receiving light from the other emitting end surface, the external resonator including a wavelength selecting element and a reflecting member disposed on an optical path for receiving the light, with the reflecting member disposed on the optical path opposite the wavelength selecting element from the semiconductor laser.

A third aspect of the present invention is a light wavelength conversion module according to either of the first and second aspects, wherein the wavelength band has a length $\Delta\lambda$, and a wavelength interval of the longitudinal mode spectra of the semiconductor laser is $\Delta\lambda_m$, and the number of the longitudinal mode spectra is $N_{max}$, which is an integer part of the quotient of $\Delta\lambda/\Delta\lambda_m$ or less.

A fourth aspect of the present invention is a light wavelength conversion module according to either of the first and second aspects, wherein the light wavelength conversion element and the semiconductor laser are optically coupled directly to each other.

A fifth aspect of the present invention is a light wavelength conversion module according to either of the first and second aspects, wherein the light wavelength conversion element is a quasi-phase matching type light wavelength conversion element which performs wavelength conversion by quasi-phase matching.

A sixth aspect of the present invention is a light wavelength conversion module according to either of the first and second aspects, further including a driving device for driving the semiconductor laser in a modulated state according to a modulation signal.

A seventh aspect of the present invention is a light wavelength conversion module according to either of the first and second aspects, further including a driving device for driving the semiconductor laser at high frequency.

An eighth aspect of the present invention is a light wavelength conversion module according to the seventh aspect, further including another driving device for driving the semiconductor laser in a modulated state at a frequency less than the high frequency.

A ninth aspect of the present invention is a light wavelength conversion module according to either of the first and second aspects, wherein the wavelength selecting element has a light transmission half-width through which the plurality of longitudinal mode spectra of the light of the fundamental wavelength is transmissible.

A tenth aspect of the present invention is a light wavelength conversion module according to the ninth aspect, wherein the half-width of the wavelength selecting element is 0.5 nm or more.

An eleventh aspect of the present invention is a light wavelength conversion module according to either of the first and second aspects, wherein the semiconductor laser has opposite ends, and a reflection reducing coating having a reflectance of 20% or more is provided on at least one end surface of the semiconductor laser.

A twelfth aspect of the present invention is a light wavelength conversion module according to either of the first and second aspects, wherein the light wavelength conversion element includes a light waveguide formed by a proton exchange annealing process.

A thirteenth aspect of the present invention is a light wavelength conversion module according to either of the first and second aspects, wherein the light wavelength conversion element includes an optical crystal base formed of $LiNbO_3$ doped with MgO or ZnO, or formed of $LiTaO_3$ doped with MgO or ZnO.

In order to investigate the causes of the above-described increase and decrease in the output light amount of the SHG element, the present inventors utilized the optical system, which is shown in FIG. 11 and is formed by a semiconductor laser provided with an external resonator for locking wavelengths, and let an oscillation spectrum of the semiconductor laser 110, in a state in which the wavelength thereof was locked, pass through an optical fiber 112 and magnified the range by an optical spectrum analyzer 114 to observe the oscillation spectrum of the semiconductor laser 110. In FIG. 11, reference numeral 116 indicates an external mirror which forms the external resonator, reference numerals 118, 120 and 122 indicate lenses, and reference numeral 124 indicates a band-pass filter. A semiconductor laser, which had an oscillation wavelength of 950 nm and had a light output of 70 mW when the laser was driven by a 200 mA current, and in which the external resonator had a length of 750 µm and the input and output end surfaces had a reflectance of 20 to 30%, was used as the semiconductor laser 110. A dielectric multi-layer film reflecting mirror having a reflectance of 99% was used as the mirror 116. Lenses having a numerical aperture of 0.5 were used as the lenses 118, 120 and 122. A band-pass filter having a half-width of transmitted light of 0.5 nm and a transmittance of the central wavelength of 80% was used as the band-pass filter 124.

According to the observations of the present inventors, the oscillation wavelength of the semiconductor laser repeatedly fluctuated within a width of about 0.2 nm in the vicinity of a central wavelength of waves transmitted through the band-pass filter. More precisely, as shown in FIG. 12, as the driving current increases, the oscillation wavelength gradually moves within a range of transmitted wavelengths of the band-pass filter from a shorter wavelength side to a longer wavelength side, and when it reaches the right end (the longer wavelength side), the oscillation wavelength hops to the left end (the shorter wavelength side). This hopping of the oscillation wavelength is repeated. It is assumed that when a second harmonic wave is generated by optically coupling the semiconductor laser with the SHG element, the IL characteristic repeatedly increases and decreases due to this wavelength hop.

According to the studies of the present inventors, it is believed that the aforementioned wavelength hop is caused by the following phenomena. In a semiconductor laser, the both end surfaces of the laser element oscillate a laser beam as a resonator, so that several spectra of the oscillation wavelength are observed. This oscillation is oscillation in the Fabry-Pérot mode (FP mode) of the semiconductor laser, and oscillation with two or more spectra is referred to as oscillation in which the so-called longitudinal mode is a multi-mode. In a case in which the longitudinal mode is a multi-mode, when locking of the wavelength is carried out by using the above-described external resonator, laser oscillation occurs only when the oscillation wavelength by the FP mode coincides with a central transmitted wavelength having the highest transmittance of the band-pass filter, thereby locking the wavelength.

On the other hand, the FP mode of the semiconductor laser shifts gradually toward the longer wavelength side due to the generated heat as the driving current increases. Therefore, even in the wavelength locked state, the FP mode of the semiconductor laser shifts minutely within the range of transmitted wavelengths of the band-pass filter. When a single FP mode moves toward the longer wavelength side as described above and the transmittance of the band-pass filter with respect to the single FP mode deteriorates such that the oscillation mode is stopped, the next FP mode adjacent to the previous FP mode at the shorter wavelength side thereof enters into the range of transmitted wavelengths of the band-pass filter and this FP mode oscillates the laser beam. Accordingly, it seems that, as the driving current increases and decreases, the oscillation wavelength repeats hopping with an interval (0.2 nm in the above-described example) coinciding with the FP mode interval of the semiconductor laser.

In accordance with the present invention, a semiconductor laser, which includes an external resonator provided with a wavelength selecting element, emits a fundamental wave including a plurality of longitudinal mode spectra within a range of an acceptable wavelength band of a light wavelength conversion element. Thus, even if a wavelength hop occurs in any oscillation spectrum, a wavelength hop does not occur in other oscillation spectra, thereby enabling oscillation with a relatively stable wavelength. Accordingly, when a wavelength conversion to a second harmonic wave or the like is carried out by optically coupling the semiconductor laser and the light wavelength conversion element such as an SHG element, the IL characteristic varies monotonically. That is, the output light amount of the light wavelength conversion element increases monotonically as the driving current of the semiconductor laser increases.

Moreover, the number of the longitudinal mode spectra is determined such that the spectra exist within the acceptable wavelength band of the wavelength conversion element. However, as the number increases, the power of the wavelength-converted wave such as the second harmonic wave deteriorates. Thus, the number of the longitudinal mode spectra is preferably at most $N_{max}$, which is the integer part of the quotient of $\Delta\lambda/\Delta\lambda_m$, where $\Delta\lambda$ is the acceptable wavelength band of the light wavelength conversion element and $\Delta\lambda_m$ is the wavelength interval of the longitudinal mode spectra of the semiconductor laser. In the formula, $\Delta\lambda$ is a wavelength band in which the output of the light whose wavelength has been converted by the light wavelength conversion element is one-half of the maximum value, i.e., a half-width.

For example, in a case in which a module is formed by optically coupling a semiconductor laser of 950 nm with an SHG element having a periodic domain reversing structure with a period of 4.7 µm, an acceptable wavelength band $\Delta\lambda$ of the SHG element varies depending on a periodic reversal length Lc of the SHG element. When Lc is 10 mm, $\Delta\lambda$ is 0.11 nm, and when Lc is 1 mm, $\Delta\lambda$ is 1.2 nm. However, in order to obtain a practical output light amount (0.1 mW or more) of the SHG element, the periodic reversal length Lc of the SHG element needs to be 1 mm or more, and the maximum value of $\Delta\lambda$ at this time is 1.2 nm. Assuming that a wavelength interval $\Delta\lambda_m$ of the longitudinal mode spectra of the semiconductor laser is 0.2 nm, $N_{max}$ is 6. That is, in this case, up to six longitudinal mode spectra are acceptable. In this way, the value of $\Delta\lambda$ can be determined by the target output light amount of the SHG element, and the value of $N_{max}$ can be obtained properly in accordance with the determined value of $\Delta\lambda$.

There are several methods for causing a semiconductor laser having an external resonator provided with a wavelength selecting element to emit a fundamental wave including a plurality of longitudinal mode spectra within an acceptable wavelength band of a light wavelength conversion element. Such methods include, for example, 1) driving the semiconductor laser at a high frequency; 2) setting the half-width of transmitted light of the wavelength selecting element to a width through which a plurality of longitudinal mode spectra included in the fundamental wave emitted from the semiconductor laser can be transmitted; and 3) providing a reflection reducing coating having a reflectance of 20% or more on at least one of end surfaces of the semiconductor laser.

The longitudinal mode spectrum in accordance with the present invention means a spectrum which can be decomposed when it is measured by an optical spectrum analyzer having a resolving power of about 0.1 nm.

BRIEF DESCRIPTION OF THE DRAWINGS

FIG. 1 is a schematic side view showing the structure of a light wavelength conversion module according to a first embodiment of the present invention.

FIG. 2 is a circuit diagram showing a driving circuit of the light wavelength conversion module according to the first embodiment.

FIG. 3 is a graph showing a change in an output light amount of a light wavelength conversion element with respect to a driving current of a semiconductor laser in the light wavelength conversion module according to the first embodiment.

FIG. 4 is a schematic side view showing the structure of an acousto-optical modulator.

FIG. 5A is a circuit diagram showing an example of a modulation circuit of the light wavelength conversion module according to the first embodiment.

FIG. 5B is a circuit diagram showing another example of a modulation circuit.

FIG. 6A is a graph indicating changes over the passage of time of SHG light which has been intensity-modulated.

FIG. 6B is a graph indicating changes over the passage of time of SHG light whose pulse width has been modulated.

FIG. 7 is a diagram for explanation of a change in a light amount returned from an external resonator of a light wavelength conversion module according to a second embodiment.

FIGS. 8A, 8B, and 8C are diagrams showing relationships between a transmission property of a band-pass filter and an oscillation state of a semiconductor laser of a light wavelength conversion module according to a third embodiment.

FIG. 9 is a graph showing changes in oscillation spectra of the semiconductor laser prior to the locking of the wavelength when the driving current increases.

FIG. 10A is a graph showing a change in an output light amount of the semiconductor laser with respect to the driving current of the semiconductor laser.

FIG. 10B is a graph showing a change in an output light amount of an SHG element with respect to the driving current of the semiconductor laser.

FIG. 11 is a schematic diagram showing the structure of an optical system which is used for observing oscillation spectra of the semiconductor laser.

FIG. 12 is a graphic chart showing changes in oscillation spectra of the semiconductor laser after the wavelength is locked, in a case in which the driving current increases.

DESCRIPTION OF THE PREFERRED EMBODIMENTS

Referring to the drawings, a light wavelength conversion module of the present invention will be described in detail hereinafter.

[First Embodiment]

FIG. 1 schematically illustrates the structure of a light wavelength conversion module in accordance with a first embodiment of the present invention. The light wavelength conversion module includes a semiconductor laser (laser diode) 10, a collimator lens 12 which makes laser beams (rearward emitted light) 11R emitted from the semiconductor laser 10 in a divergent condition into parallel light, a condensing lens 13 converging the parallel laser beams 11R, a narrow band-pass filter 14 disposed between the lenses 12 and 13 as a wavelength selecting element, a mirror 20 disposed at a convergent position where the laser beams 11R are converged by the condensing lens 13, and a so-called quasi-phase matching type light wavelength conversion element 15 which is optically coupled directly with a front end surface of the semiconductor laser 10. The semiconductor laser 10 is connected to a driving circuit 40 for the semiconductor laser (FIG. 2). The structure and the driving method of the driving circuit 40 will be described later.

The light wavelength conversion element 15 is structured by a periodic domain reversing structure in which domain reversing segments 17 are formed periodically on a crystal base 16, and a channel light waveguide 18 extending along the periodic domain reversing structure. The crystal base 16 is formed by doping ferroelectric $LiNbO_3$, which has a nonlinear optical effect, with, for example, 5 mol % of MgO (the MgO-doped $LiNbO_3$ will be referred to as "MgO—LN", hereinafter). In the domain reversing segment 17, the direction of spontaneous polarization parallel to the Z-axis of the base is reversed.

The periodic domain reversing structure is formed such that the domain reversing segments 17 are disposed along the direction of the X-axis of the base 16. Considering the wavelength dispersion of the refractive index of MgO—LN, the period $\Lambda$ of the periodic domain reversing structure is set to be a first order period with respect to the wavelength of the laser beam. For example, when the wavelength of the laser beam is 950 nm, the period $\Lambda$ is set to be 4.75 $\mu$m. Such a periodic domain reversing structure can be formed by, for example, adopting the method disclosed in JP-A No. 6-242478.

The channel light waveguide 18 can be manufactured by a method such as a method including steps of forming a metal mask pattern on a +Z-surface of the base 16 by well-known photolithographic and lift-off processes after forming the domain reversing segments 17, performing a proton exchange process by immersing the base 16 in pyrophosphoric acid, and performing an annealing process after removing the mask. Both end surfaces 18a and 18b of the channel light waveguide 18 are then edge-polished. An AR (anti-reflective) coating 30 which prevents reflection of a laser beam 11, which is a fundamental wave, is applied to an end surface of an element including the end surface 18a, and an AR (anti-reflective) coating 31 which prevents reflection of a second harmonic wave 19 (described later) is applied to an end surface of the element including the end surface 18b, thereby completing the light wavelength conversion element 15.

Operation of the light wavelength conversion module will be described hereinafter. The rearward emitted light 11R emitted from the semiconductor laser is reflected by the mirror 20 and is fed back to the semiconductor laser 10. That is, in this apparatus, a front end surface of the semiconductor laser 10 and the mirror 20 form an external resonator of the semiconductor laser 10. The length of the external resonator is, for example, 50 mm.

The wavelength of the laser beam 11 to be transmitted through the narrow band-pass filter 14 is selected by the narrow band-pass filter 14 disposed in the external resonator. The semiconductor laser 10 oscillates at the selected wavelength. Since the selected wavelength varies according to the rotational position of the narrow band-pass filter 14 (the rotational position in the directions indicated by arrow A in FIG. 1), the oscillation wavelength of the semiconductor laser 10 can be selected and locked, by rotating the narrow band-pass filter 14 appropriately, to a wavelength within the range of transmitted wavelengths of the narrow band-pass filter 14, that is, to a wavelength which phase-matches with the period of the domain reversing segments 17.

The laser beam 11 emitted from the semiconductor laser 10 enters the channel light waveguide 18. The laser beam 11 is waveguided in a TE mode through the channel light waveguide 18, and is phase-matched (so-called quasi-phase matched) in the periodic domain reversing region of the waveguide 18. Then, the laser beam 11 is converted to a second harmonic wave 19 having one-half the wavelength of the laser beam 11. For example, when a laser beam having a central wavelength of 950 nm enters the channel light waveguide 18, the laser beam is converted to a second harmonic wave having a wavelength of 475 nm. This second harmonic wave 19 is also propagated through the channel light waveguide 18 in a guided wave mode, and emitted from the end surface 18b of the light waveguide.

The laser beam 11, whose wavelength has not been converted, is also emitted from the end surface 18b of the light waveguide in a divergent state. The laser beam 11 and the second harmonic wave 19 are transformed into parallel rays by a collimator lens (not shown). The second harmonic wave 19 can be used for a certain application after being separated from the laser beam 11 by a band-pass filter, a dichroic mirror, or the like (not shown).

The driving mechanism of the semiconductor laser 10 will be described hereinafter. As shown in FIG. 2, the driving circuit 40 of the semiconductor laser is formed by a DC power circuit 41 provided with an automatic power control (APC) circuit, an AC power supply 43, and a bias T45 which is formed of a coil 42 and a capacitor 44. In the driving circuit 40, the high frequency waveform generated from the AC power supply 43 and passing through the capacitor 44 is superimposed on a direct current component generated from the DC power circuit 41 and passing through the coil 42. The resultant current on which the high frequency waveform has been superimposed is applied to the semiconductor laser 10. Accordingly, the semiconductor laser 10 is driven at a high frequency.

In accordance with the present embodiment, the semiconductor laser 10 is driven at a high frequency, and the central oscillation wavelength of the semiconductor laser 10 is locked by the external resonator provided with the band-pass filter 14 to a wavelength in the vicinity of a central wavelength of waves transmitted through the narrow band-pass filter 14.

When the semiconductor laser 10 is driven at a high frequency without locking the wavelength, the oscillation state of the semiconductor laser becomes random, and the number of longitudinal mode spectra of oscillation increases. (For example, although there is only one longitudinal mode spectrum when a direct current is applied, the number of longitudinal mode spectra increases to from several spectra to several tens of spectra when the semiconductor laser 10 is driven at a high frequency.) On the other hand, when the wavelength is locked at the time the semiconductor laser 10 is driven at a high frequency, the number of longitudinal mode spectra of oscillation of the semiconductor laser 10 is several spectra.

An optical system similar to the one shown in FIG. 11 was manufactured by using the following components: as the semiconductor laser 10, a semiconductor laser was used having an oscillation wavelength of 950 nm, an output of 70 mW when driven by a 200 mA current, a reflectance of the LR (low reflectance) coating 32 provided at both end surfaces (cleavage planes) with respect to the light of the oscillation wavelength being in a range of 20 to 30%, and a resonator length of 750 μm; as the narrow band-pass filter 14, a narrow band-pass filter having a half-width of transmitted light of 0.5 nm and a transmittance of central wavelength of 80% is used; as the collimator lens 12 and the condensing lens 13, lenses having a numerical aperture of 0.5 are used; and as the mirror 20, a dielectric multi-layered film reflecting mirror having a reflectance of 99% is used. In this optical system, when the wavelength was locked and the oscillation spectrum of the semiconductor laser 10, which was driven at high frequency by a high frequency waveform of (for example, 10 to 50 MHz) being superposed, was passed through an optical fiber and was observed by using a light spectrum analyzer, two or three longitudinal mode spectra of oscillation of the semiconductor laser 10 were observed.

In accordance with the present embodiment as described above, the number of longitudinal mode spectra of oscillation of the semiconductor laser increases by driving the semiconductor laser at a high frequency and locking the wavelength at the same time. Accordingly, as shown in FIG. 3, the sensitivity of the light wavelength conversion element to wavelengths deteriorates, so that the IL characteristic of the light wavelength conversion element changes monotonically, thereby facilitating the APC control.

Moreover, the light wavelength conversion module in accordance with the present embodiment may be provided with a light modulation device, as described below, which modulates a laser beam emitted from the light wavelength conversion element.

As shown in FIG. 4, the light wavelength conversion module of the present embodiment can modulate laser beam by an external modulation device using an acousto-optical modulator (AOM). As shown in FIG. 4, the external modulation device is structured by an AOM 100 which is formed by an acousto-optical medium 101 and a transducer 102 for providing vibration to the acousto-optical medium 101, and an oscillator 103 which applies high-frequency signals to the transducer 102. The oscillator 103 is connected to the transducer 102 via a mixer 104, to which external electric signals are input, and an RF (radio frequency) amplifier 105.

The second harmonic wave 19 emitted from the light wavelength conversion element 15 enters into the acousto-optical medium 101 via the condensing lens 13, and proceeds straight through the acousto-optical medium 101 when the transducer 102 is not being vibrated by high-frequency signals of about 100 to 200 MHz output from the oscillator 103. On the other hand, when the transducer 102 is vibrated by high-frequency signals, an ultrasonic wave is generated at the transducer 102. The ultrasonic wave changes the distribution of the refractive index within the acousto-optical medium 101, thereby forming a diffraction grating. The second harmonic wave 19 which has entered into the acousto-optical medium 101 is refracted by the diffraction grating.

The diffraction efficiency η, and thus the light intensity, change according to the intensity of the ultrasonic wave generated at the transducer 102. Therefore, when the high-frequency signals are amplitude-modulated by means of controlling the voltage level of the electrical signals applied to the transducer 102, the diffraction efficiency η changes according to the amplitude of the electrical signals, so that intensity modulation of the SHG light can be carried out. For example, when the high-frequency signals are amplitude-modulated either to zero amplitude or to a predetermined amplitude, the light to be modulated is modulated on and off. When the high-frequency signals are amplitude-modulated continuously, the light to be modulated will be intensity-modulated continuously.

Moreover, instead of the driving circuit 40, a light modulation driving circuit 50 shown in FIG. 5A may be used to modulate the intensity of the semiconductor laser light by means of direct modulation, thereby enabling intensity modulation of the SHG light.

The light modulation driving circuit 50 is structured by a DC power circuit 51 provided with an APC, an amplifier 52 into which modulation signals enter, a coil 53, a high-frequency transmitter 54 for superimposing a high-frequency signal on a driving current, and a capacitor 55. In the light modulation driving circuit 50, a direct current component generated from the DC power circuit 51 is amplified by the amplifier 52 according to the modulation signals. A high frequency waveform, which has been generated from the high-frequency transmitter 54 and has passed through the capacitor 55, is superimposed on the amplified direct current which has passed through the coil 53. The resultant current on which the high frequency waveform has been superimposed is applied to the semiconductor laser 10 to thereby drive the semiconductor laser 10 in a modulated state.

Conventionally, when the oscillation wavelength of a semiconductor laser is locked, the output light amount of the light wavelength conversion element does not increase monotonically as the driving current of the semiconductor laser increases. Therefore, there has been a problem in that even if the SHG light is intensity-modulated by directly modulating the driving current of the semiconductor laser, it is difficult to control the output light amount of the SHG light to be a predetermined value. Further, in the light wavelength conversion element using a semiconductor laser as a light source, it has been difficult to carry out intensity modulation of SHG light with high accuracy by directly modulating the semiconductor laser.

In the light wavelength conversion module in accordance with the present embodiment, since the IL characteristic of the light wavelength conversion element changes monotonically, the SHG light can be intensity-modulated with high accuracy by directly modulating the driving current of the semiconductor laser as shown in FIG. 6A. Accordingly, intensity modulation of the SHG light can be carried out without using an expensive external modulator such as the above-described AOM, thereby enabling designing of a low cost compact optical system.

Moreover, instead of the driving circuit 40, a light modulation driving circuit 60 shown in FIG. 5B may be used to modulate the pulse width of the semiconductor laser at a frequency lower than the driving frequency. In this way, the semiconductor laser is directly driven in a modulated state, thereby enabling intensity modulation of the SHG light.

The light modulation driving circuit 60 is formed by a DC power circuit 51 provided with an APC, a coil 53, a high-frequency transmitter 54 for superimposing a high-frequency signal on a driving current, a capacitor 55, and a switching element 56 which is turned on and off by a modulation signal composed of pulse signals having a frequency lower than the high frequency waveform superimposed on the driving current. In the light modulation driving circuit 60, the high-frequency waveform, which has been generated from the high-frequency transmitter 54 and has passed through the capacitor 55, is superimposed on the direct current component which has been generated from the DC power circuit 51 and has passed through the coil 53, and pulse width modulation is carried out by turning the switching element 56 on and off. Since the resultant direct current component on which the high frequency waveform has been superimposed is modulated by a pulse signal of a frequency lower than the high frequency by means of the switching element 56, high-frequency components of the SHG light for several periods are contained in a single pulse. The driving current whose pulse width has been modulated is applied to the semiconductor laser 10 to thereby modulate the pulse width of the semiconductor laser 10.

Although pulse width modulation has been described above, it is also possible to modulate the SHG light by repeatedly turning the driving current of the semiconductor laser on and off as shown in FIG. 6B, thereby directly carrying out pulse width modulation of the driving current of the semiconductor laser. Although the signal intensity is modulated by the pulse width in pulse width modulation, in the light wavelength conversion module of the present embodiment, the peak value of each pulse is kept constant because the IL characteristic changes monotonically, thereby enabling stable modulation of the SHG light.

The output level of the high-frequency transmitter 54 may be changed according to the modulation signals. By changing the output level of the high-frequency transmitter 54, the semiconductor laser 10 can be driven by a signal on which a high frequency waveform has been completely superimposed throughout the entire modulation level. Moreover, the semiconductor laser may also be driven in a modulated state by forming the required signal waveform by a digital circuit and by supplying the obtained signal waveform to the driver of the semiconductor laser 10. In this case, any arbitrary signal waveform can be obtained from the digital circuit.

[Second Embodiment]

FIG. 7 schematically illustrates the structure of a light wavelength conversion module in accordance with a second embodiment of the present invention. This light wavelength conversion module has the same structure as that of the light wavelength conversion module in accordance with the first embodiment except that, in the present second embodiment, a coating 32h having a reflectance higher than the coating (32) applied to the other end surface is applied to the end surface at the side positioned in the external resonator of the semiconductor laser 10 (i.e., the rear emitting end surface) and the semiconductor laser 10 is driven in a modulated state without a high frequency waveform being superimposed on the driving current. Thus, the same reference numerals are used to designate identical elements, and description thereof will be omitted.

In the present embodiment, due to the application of the coating 32h, which has a reflectance higher than that of the coating 32 applied to the front emitting end surface, onto the rear emitting end surface of the semiconductor laser 10, the emitted light is oscillated by the external resonator and the light amount fed back to the semiconductor laser 10 decreases. Accordingly, the number of longitudinal mode spectra of oscillation is increased without locking the semiconductor laser 10 sufficiently.

For example, in a case in which a semiconductor laser having an oscillation wavelength of 950 nm, an output of 70 mW when driven by a 200 mA current, a reflectance of the LR (low reflectance) coating 32 provided at both end surfaces (cleavage planes) with respect to the light of the oscillation wavelength being in a range of 20 to 30%, and a resonator length of 750 $\mu$m is used as the semiconductor laser 10, and a narrow band-pass filter having a half-width of transmitted light of 0.5 nm and a transmittance of central wavelength of 80% is used as the narrow band-pass filter 14, and lenses having a numerical aperture of 0.5 are used as the collimator lens 12 and the condensing lens 13, and a dielectric multi-layered film reflecting mirror having a reflectance of 90% is used as the mirror 20, the reflectance of the coating 32h with respect to the light of the oscillation wavelength is preferably in a range of 20 to 70%.

When the reflectance of the coating 32h is 70%, as shown in FIG. 7, 70% of the light amount incident on the rear emitting end surface of the semiconductor laser 10 is reflected by the rear emitting end surface, and 30% of the light amount is oscillated by the external resonator. When the transmittance of the narrow band-pass filter 14 is 80% and the reflectance of the mirror 20 is 90%, the light amount fed back to the semiconductor laser 10 is 5.2% of the light amount incident on the rear emitting end surface. In this state, the oscillation wavelength of the semiconductor laser 10 is hardly locked and the longitudinal mode of oscillation becomes a multi-mode.

On the other hand, when the reflectance of the coating 32h is 20%, 20% of the light amount incident on the rear emitting end surface of the semiconductor laser 10 is reflected by the rear emitting end surface, and 80% of the light amount is oscillated by the external resonator. The light amount fed back to the semiconductor laser 10 is 40% of the light amount incident on the rear emitting end surface. In this state, the oscillation by the external resonator is dominant, and the number of longitudinal modes of oscillation is two when the reflectance of coating 32h is 20% or more, whereas the longitudinal mode of oscillation is a single mode when the percentage is less than 20%.

As described above, in the present embodiment, the light amount fed back to the semiconductor laser after oscillation by the external resonator decreases, and the number of the longitudinal mode spectra of oscillation increases without locking the oscillation wavelength of the semiconductor laser sufficiently. Accordingly, the sensitivity of the light wavelength conversion element to the wavelength deteriorates, and the IL characteristic changes monotonically. As a result, APC control is facilitated, and intensity modulation or pulse width modulation of the wavelength-converted wave can be carried out with high accuracy by directly modulating the driving current of the semiconductor laser.

In the present embodiment, the range of the reflectance of the coating applied to the rear emitting end surface side of the semiconductor laser 10 is set to 20 to 70%. However, this range may vary in accordance with the types and/or structures of the semiconductor laser.

[Third Embodiment]

A light wavelength conversion module in accordance with a third embodiment has the same structure as that of the light wavelength conversion module in accordance with the first embodiment except that, in the present third embodiment, a half-width of transmitted light of the narrow band-pass filter 14 is set to a width through which a plurality of longitudinal mode spectra included in the fundamental wave emitted from the semiconductor laser 10 can be transmitted, and the semiconductor laser 10 is driven in a modulated state without a high frequency waveform being superimposed on the driving current. Thus, the same reference numerals are used to designate identical elements, and description thereof will be omitted.

In the present third embodiment, the acceptable number of longitudinal mode spectra of oscillation increases due to the broadening of the range of transmitted wavelengths of the narrow band-pass filter. For example, the number of longitudinal modes is one when the half-width of transmitted light of the narrow band-pass filter 14 is 0.5 nm as shown in FIG. 8A. The number is three when the half-width of transmitted light is 1.0 nm as shown in FIG. 8B, and is five when the half-width of transmitted light is 1.5 nm as shown in FIG. 8C.

As described above, in the present third embodiment, the acceptable number of longitudinal mode spectra of oscillation of the narrow band-pass filter which is a light wavelength conversion element increases, thereby lowering the sensitivity of the light wavelength conversion element to the wavelength, so that the IL characteristic changes monotonically. Accordingly, APC control is facilitated, and intensity modulation or pulse width modulation of the wavelength-converted wave can be carried out with high accuracy by directly modulating the driving current of the semiconductor laser.

The present invention has an excellent effect in that the output light amount of a light wavelength conversion element increases continuously as the driving current of a semiconductor laser increases. Accordingly, automatic power control (APC) can be carried out easily, and modulation of the output light with high accuracy becomes possible, thereby enabling designing of a low cost compact optical system.

What is claimed is:

1. A light wavelength conversion module comprising:
a semiconductor laser having a resonator side emitting a first beam from the resonator side;
a reflective mirror facing the resonator side of said semiconductor laser and receiving the first beam;
a wavelength selecting element disposed between said semiconductor laser and said reflective mirror and positioned to receive the first beam and select an oscillation wavelength of the first beam, so that only a selected oscillation wavelength reflects off the reflective mirror back to the semiconductor laser; and
a light wavelength conversion element optically coupled to said semiconductor laser on a side other than the resonator side, with said light wavelength conversion element placed to receive a second laser beam having a plurality of longitudinal mode spectra from said semiconductor laser, the conversion element configured to output second harmonic generation light;
wherein the selected oscillation wavelength of said semiconductor laser is locked by an external resonator comprising the resonator side of said semiconductor laser and said reflective mirror and the output amount of the second harmonic generation light is stabilized by the locking of the oscillation wavelength of the semiconductor laser;
whereby an output light amount of the light wavelength conversion element increases monotonically as a driving current of said semiconductor laser increases.

2. The light wavelength conversion module as claimed in claim 1, wherein said light wavelength conversion element has a wavelength band and emits light having a wavelength different from that of said second laser beam when the received light is within a selected wavelength band.

3. A light wavelength conversion module according to claim 1, wherein the wavelength band has a length $\Delta\lambda l$, and a wavelength interval of the longitudinal mode spectra of the semiconductor laser is $\Delta\lambda m$, and the number of the longitudinal mode spectra is Nmax, which is an integer part of the quotient of $\Delta\lambda l/\Delta\lambda m$ or less.

4. A light wavelength conversion module according to claim 1, wherein the light wavelength conversion element and the semiconductor laser are optically coupled directly to each other.

5. A light wavelength conversion module according to claim 1, wherein the light wavelength conversion element is a quasi-phase matching type light wavelength conversion element which performs wavelength conversion by quasi-phase matching.

6. A light wavelength conversion module according to claim 1 further comprising a driving device for driving the semiconductor laser in a modulated state according to a modulation signal.

7. A light wavelength conversion module according to claim 1 further comprising a driving device for driving the semiconductor laser at high frequency, which causes said semiconductor to emit light having a plurality of longitudinal mode spectra.

8. A light wavelength conversion module according to claim 7 further comprising another driving device for driving the semiconductor laser in a modulated state at a frequency less than the high frequency.

9. A light wavelength conversion module according to claim 1, wherein the wavelength selecting element has a light transmission half-width through which the plurality of longitudinal mode spectra of the light of the fundamental wavelength is transmissible.

10. A light wavelength conversion module according to claim 9, wherein the half-width of the wavelength selecting element is 0.5 nm or more.

11. A light wavelength conversion module according to claim 1, wherein a reflection reducing coating having a reflectance of 20% or more is provided on the resonator side of the semiconductor laser, which causes said semiconductor to emit the second laser beam including a plurality of longitudinal mode spectra.

12. A light wavelength conversion module according to claim 1, wherein the light wavelength conversion element includes a light waveguide formed by a proton exchange annealing process.

13. A light wavelength conversion module according to claim 1, wherein the light wavelength conversion element includes an optical crystal base formed of $LiNbO_3$ doped with MgO or ZnO, or formed of $LiTaO_3$ doped with MgO or ZnO.

14. The light wavelength conversion module as claimed in claim 1, wherein the reflective mirror and the resonator side of said semiconductor laser form an internal boundary of a resonator external to said semiconductor laser.

15. The light wavelength conversion module as claimed in claim 1 wherein said light wavelength conversion element includes a domain reversing structure and a channel light waveguide.

16. The light wavelength conversion module as claimed in claim 15 wherein said domain reversing structure includes a plurality of domain reversing segments formed periodically on a crystal base.

17. The light wavelength conversion module as claimed in claim 15 wherein said wavelength conversion element includes at least two surfaces, wherein at least one of said surfaces is anti-reflective of fundamental wavelength light and at least one of said surfaces is anti-reflective of second harmonic generation light.

18. The light wavelength conversion module as claimed in claim 1, wherein said semiconductor laser is provided with a wavelength selecting element and produces fundamental wavelength light with a plurality of longitudinal mode spectra within the wavelength band of the light wavelength conversion element and emits light in a wavelength band of said wavelength conversion element.

19. A light wavelength conversion module comprising:
a resonator with an internal boundary formed by a semiconductor laser and a reflective mirror;
a wavelength selecting element disposed between said semiconductor laser and said reflective mirror to select an oscillation wavelength at which a semiconductor laser emitted beam will pass to said reflective mirror; and a light wavelength conversion element optically coupled to said semiconductor laser placed to receive laser light from said semiconductor laser and configured to output light having a wavelength different from that of said received laser light;

wherein an oscillation wavelength of said semiconductor laser is locked by said resonator; and said semiconductor laser emits light having a plurality of longitudinal mode spectra;

and an output light amount of the light wavelength conversion element increases monotonically as a driving current of said semiconductor laser increases.

20. The light wavelength conversion module comprising:

a semiconductor laser having a front end emitting surface and a rear end emitting surface, wherein said semiconductor laser emits, from said rear emitting end surface, fundamental wavelength light having a plurality of longitudinal mode spectra within a wavelength band;

a resonator, external to said semiconductor laser, which includes a reflecting member disposed along an optical path and a wavelength selecting element disposed along said optical path between said reflecting member and said semiconductor laser to receive said light from a rear emitting end surface and to reflect said received light to said semiconductor laser front emitting end surface, wherein said resonator locks an oscillation wavelength of said semiconductor laser; and a light wavelength conversion element that upon receiving said fundamental light within said wavelength band, emits light having a wavelength different from said fundamental wavelength;

and an output light amount of the light wavelength conversion element increases monotonically as a driving current of said semiconductor laser increases.

21. A light wavelength conversion module according to claim 20, wherein the wavelength band has a length $\Delta\lambda l$, and a wavelength interval of the longitudinal mode spectra of the semiconductor laser is $\Delta\lambda m$, and the number of the longitudinal mode spectra is Nmax, which is an integer part of the quotient of $\Delta\lambda l/\Delta\lambda l$ or less.

22. A light wavelength conversion module according to claim 20, wherein the light wavelength conversion element and the semiconductor laser are optically coupled directly to each other.

23. A light wavelength conversion module according to claim 20, wherein the light wavelength conversion element is a quasi-phase matching type light wavelength conversion element which performs wavelength conversion by quasi-phase matching.

24. A light wavelength conversion module according to claim 20 further comprising a driving device for driving the semiconductor laser in a modulated state according to a modulation signal.

25. A light wavelength conversion module according to claim 20 further comprising a driving device for driving the semiconductor laser at high frequency.

26. A light wavelength conversion module according to claim 25 further comprising another driving device for driving the semiconductor laser in a modulated state at a frequency less than the high frequency.

27. A light wavelength conversion module according to claim 20, wherein the wavelength selecting element has a light transmission half-width through which the plurality of longitudinal mode spectra of the light of the fundamental wavelength is transmissible.

28. A light wavelength conversion module according to claim 27, wherein the half-width of the wavelength selecting element is 0.5 nm or more.

29. A light wavelength conversion module according to claim 20, wherein the semiconductor laser has opposite ends, and a reflection reducing coating having a reflectance of 20% or more is provided on at least one end surface of the semiconductor laser.

30. A light wavelength conversion module according to claim 20, wherein the light wavelength conversion element includes a light waveguide formed by a proton exchange annealing process.

31. A light wavelength conversion module according to claim 20, wherein the light wavelength conversion element includes an optical crystal base formed of $LiNbO_3$ doped with MgO or ZnO, or formed of $LiTaO_3$ doped with MgO or ZnO.

* * * * *